(12) United States Patent
Barth, Jr.

(10) Patent No.: US 7,692,990 B2
(45) Date of Patent: *Apr. 6, 2010

(54) MEMORY CELL ACCESS CIRCUIT

(75) Inventor: John E. Barth, Jr., Williston, VT (US)

(73) Assignee: International Business Machines Corporation, Armonk, NY (US)

(*) Notice: Subject to any disclaimer, the term of this patent is extended or adjusted under 35 U.S.C. 154(b) by 234 days.

This patent is subject to a terminal disclaimer.

(21) Appl. No.: 11/848,578

(22) Filed: Aug. 31, 2007

(65) Prior Publication Data

US 2008/0175083 A1 Jul. 24, 2008

Related U.S. Application Data

(63) Continuation-in-part of application No. 11/426,102, filed on Jun. 23, 2006, now Pat. No. 7,342,839.

(51) Int. Cl.
*G11C 7/00* (2006.01)
(52) U.S. Cl. ......................... 365/208; 365/205
(58) Field of Classification Search ................. 365/208, 365/205
See application file for complete search history.

(56) References Cited

U.S. PATENT DOCUMENTS

| | | | |
|---|---|---|---|
| 6,009,024 A | 12/1999 | Hirata et al. | |
| 6,038,193 A | 3/2000 | Wang et al. | |
| 6,058,065 A | 5/2000 | Lattimore et al. | |
| 6,178,134 B1 | 1/2001 | Evans et al. | |
| 6,259,634 B1 | 7/2001 | Kengeri et al. | |
| 6,262,914 B1 | 7/2001 | Smayling et al. | |
| 6,522,565 B2 | 2/2003 | Shimazaki et al. | |
| 6,552,944 B2 | 4/2003 | Fifield et al. | |
| 6,650,572 B2 | 11/2003 | Issa | |
| 6,697,293 B2 | 2/2004 | Brennan et al. | |
| 6,711,078 B2 | 3/2004 | Brennan et al. | |
| 6,738,300 B2 * | 5/2004 | Barth, Jr. .................... | 365/203 |
| 6,831,862 B2 | 12/2004 | Tedrow et al. | |
| 6,917,541 B2 | 7/2005 | Shimbayashi et al. | |
| 7,342,839 B2 * | 3/2008 | Barth, Jr. .................... | 365/203 |
| 2005/0052897 A1 | 3/2005 | Luk et al. | |
| 2005/0141324 A1 | 6/2005 | Ko et al. | |

OTHER PUBLICATIONS

"NFET Relay Sense Circuit," IBM TDB Jan. 1993, vol. 36, No. 1, pp. 361-362.
"Segmented Bit Line Architecture for Open and Folded Bit Line Cells," IBM TDB Aug. 1989, vol. 32, No. 3A, pp. 363-365.
"Fully-Divided Bit Line for Dynamic Random-Access Memory Sensing Circuitry," IBM TDM Dec. 1988, vol. 31, No. 7, pp. 266-272.

* cited by examiner

*Primary Examiner*—Michael T Tran
(74) *Attorney, Agent, or Firm*—David Cain

(57) ABSTRACT

A circuit for accessing a memory cell includes a local bitline and a local sense amplifier having a plurality of transistors. The local bitline may be connect the memory cell and the sense amplifier. A first global bitline may be connected to a first one of the plurality of transistors. A second global bitline may be connected to a second one of the plurality of transistors. A secondary sense amplifier may be connected to the first and second global bitlines. A design structure embodied in a machine readable medium used in a design process, includes such a circuit for accessing a memory cell.

6 Claims, 7 Drawing Sheets

MEMORY CELL ACCESS CIRCUIT

CROSS REFERENCE TO RELATED APPLICATION

This application is a continuation-in-part of U.S. patent application Ser. No. 11/426,102, filed Jun. 23, 2006 now U.S. Pat. No. 7,342,839.

FIELD OF THE INVENTION

The present invention generally relates to the field of memory cells. In particular, the present invention is directed to a memory cell access circuit. In addition, the present invention is directed to a design structure on which the memory cell access circuit resides.

BACKGROUND

Conventional DRAMs use sensing schemes that require amplifiers capable of sensing small sense signals. One way to amplify small sense signals has been shown to be a cross-couple sense amplifier, as is well known in the art. These cross-couple sense amplifiers require balanced true and complement bitlines to perform and operate reliably.

In conventional DRAMs, the sense signal from a memory cell is generated by charge sharing the charge stored in the memory cell with a precharged bitline, and then comparing the developed sense signal on the precharged bitline to a reference bitline.

To achieve maximum density, a large number of memory cells are typically connected to a single bitline to reduce the area overhead of the local amplifier. However, adding cells to a bitline also increases the bitline capacitance, and consequently reduces the transfer ratio ($C_{cell}/(C_{b1}+C_{cell})$), which in turn reduces the developed sense signal. Typically the number of bits (memory cells) per bitline is chosen to minimize the number of sense amps (overhead) while maintaining enough sense signal to reliably detect the stored state of a memory cell.

The amplitude of the sense signal $\Delta Vb1$ from a memory cell is a function of the cell capacitance, the bitline capacitance and the voltage swing to the bitline high precharge, as set forth in the following formulas which includes the transfer ratio.

$$\Delta Vb1 = (V_{cell} - V_{b1h}) * (C_{cell}/(C_{b1}+C_{cell})), \text{ and}$$

where $V_{cell}$=voltage stored in the memory cell
$V_{b1h}$=bitline precharge level voltage (e.g., 1.2-1.8V)
$C_{cell}$=cell capacitance
$C_{b1}$=bitline capacitance One attempt at increasing the transfer ratio is set forth in U.S. Pat. No. 6,738,300 in which a local sense amplifier having four transistors is utilized. However, this design does not readily allow an early masked write, where a subset of bits along a wordline may be written prior to wordline activation. Additionally, global bitline charging current must be distributed through a path shared with neighboring cells, which must also be decoded with row address. The charging current disadvantageously flows parallel to the wordline creating data pattern dependent voltage drops.

A smaller design local bitline sense amplifier is desired that requires less space and overcomes deficiencies of the prior art. Additionally, further decreases in bitline capacitance and increases in the transfer ratio are desired.

SUMMARY OF THE DISCLOSURE

In one embodiment, a circuit for accessing a memory cell is provided. The circuit includes a local bitline; a local sense amplifier having a plurality of transistors, the local bitline connecting the memory cell to the sense amplifier; a first global bitline connected to a first one of the plurality of transistors; a second global bitline connected to a second one of the plurality of transistors; and a secondary sense amplifier connected to the first and second global bitlines.

In another embodiment, a circuit for accessing a memory cell is provided. The circuit includes a local bitline; a first global bitline; a second global bitline; and a local sense amplifier having: a first transistor having a gate connected to the local bitline, a source connected to the first global bitline, and a drain connected to the second global bitline; a second transistor having a gate connected to the first global bitline, a drain connected to the local bitline, and a source connected to a first power supply; and a third transistor having a gate connected to the second global bitline, a source connected to a second power supply, and a drain connected to the local bitline, wherein the local bitline connects the memory cell to the sense amplifier.

In yet another embodiment, a processor comprising at least one DRAM macro is provided. The DRAM macro includes a local bitline; a local sense amplifier having a plurality of transistors, the local bitline connecting the memory cell to the sense amplifier; a first global bitline connected to a first one of the plurality of transistors; a second global bitline connected to a second one of the plurality of transistors; and a secondary sense amplifier connected to the first and second global bitlines.

In a further embodiment, a design structure embodied in a machine readable medium used in a design process is provided. The design structure includes a circuit for accessing a memory cell, the circuit including a local bitline; a local sense amplifier having a plurality of transistors, the local bitline connecting the memory cell to the sense amplifier; a first global bitline connected to a first one of the plurality of transistors; a second global bitline connected to a second one of the plurality of transistors; and a secondary sense amplifier connected to the first and second global bitlines.

In another embodiment, a design structure is provided, which includes a circuit for accessing a memory cell, the circuit including a local bitline; a first global bitline; a second global bitline; and a local sense amplifier having: a first transistor having a gate connected to the local bitline, a source connected to the first global bitline, and a drain connected to the second global bitline; a second transistor having a gate connected to the first global bitline, a drain connected to the local bitline, and a source connected to a first power supply; and a third transistor having a gate connected to the second global bitline, a source connected to a second power supply, and a drain connected to the local bitline, wherein the local bitline connects the memory cell to the sense amplifier.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Figure 1:
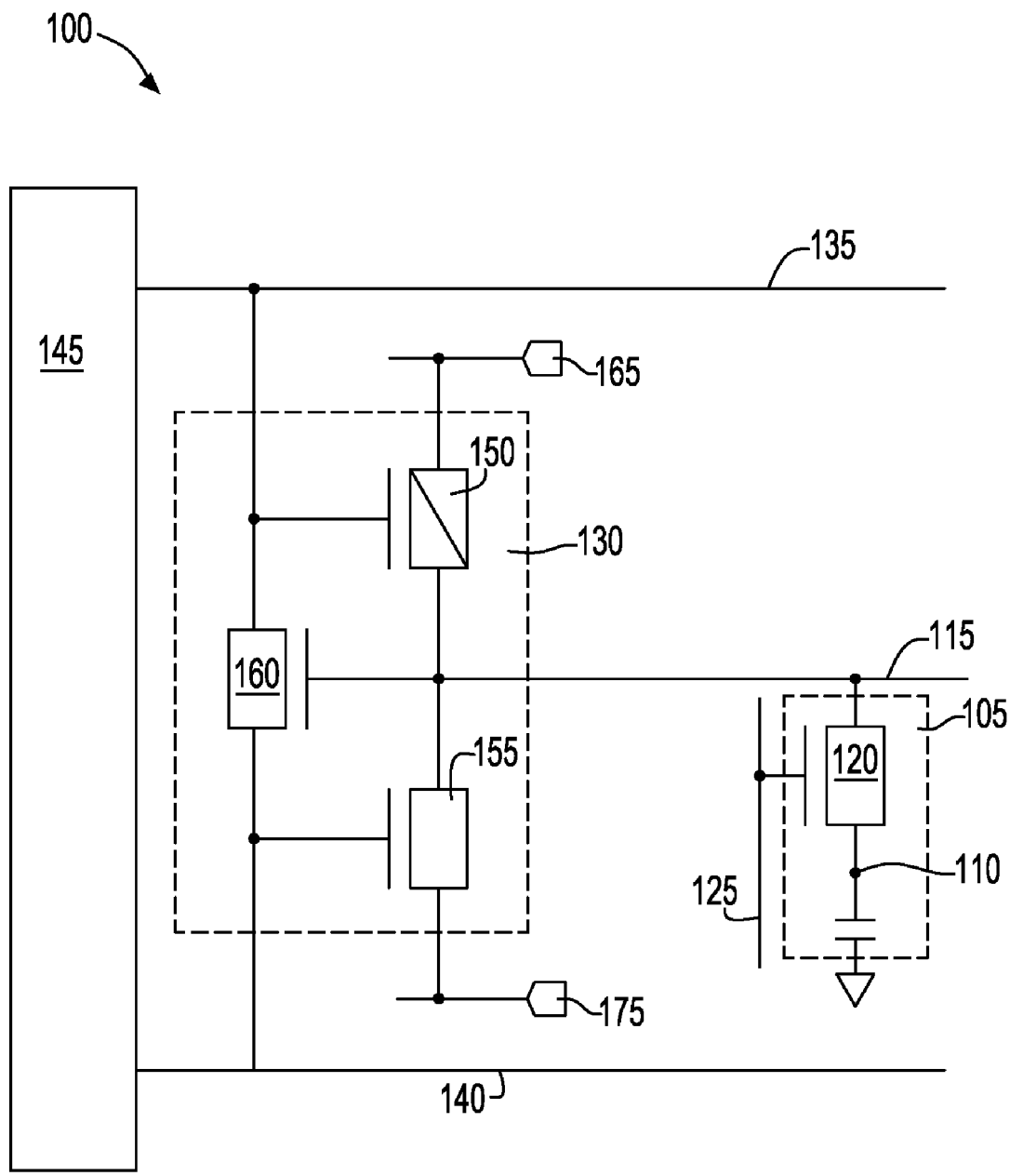
FIG. 1 shows one embodiment of a circuit for accessing a memory cell.

FIG. 1 illustrates one embodiment of a circuit 100 for accessing a memory cell 105. Memory cell 105 includes a node 110 connected to a local bitline 115 through a transistor device 120. Node 110 may store a memory value (e.g., a data value). Local bitline 115 is shown with one memory cell, memory cell 105. Local bitline may alternatively have a plurality of memory cells. In one example, the number of memory cells is determined to maximize the transfer ratio ($C_{cell}/(C_{b1}+C_{cell})$). A wordline 125 is connected to the gate of transistor device 120.

Local bitline 115 is connected to a local sense amplifier 130. Local sense amplifier 130 is connected to a global bitline 135 and to a global bitline 140. Global bitlines 135, 140 are connected to a secondary sense amplifier 145. In one example, global bitline 135 acts as a read bitline (RBL) and global bitline 140 acts as a write bitline (WBL), as will be explained in further detail below. A plurality of local sense amplifier and local bitline combinations may be connected to global bitlines 135, 140.

FIG. 1 illustrates one example of local sense amplifier 130 including three transistor devices 150, 155, 160. In this example, transistor devices 150, 155, 160 may be any of a variety of transistor devices. Example transistor devices include, but are not limited to, a positive field effect transistor (PFET), a negative field effect transistor (NFET), high VT/low/VT, and any combinations thereof.

In one example, transistor device 150 is an PFET, transistor device 155 is a NFET, and transistor device 160 is a NFET. In this example, transistor device 150 includes a gate connected to global bitline 135, a drain connected to local bitline 115, and a source connected to a power supply 165 (e.g., VDD, ground, etc.). Here the source is connected to VDD. In this example, transistor device 155 includes a gate connected to global bitline 140, a source connected to a power supply 175 (e.g., ground), and a drain connected to local bitline 115. In the example local sense amplifier, transistor device 160 includes a gate connected to local bitline 115, a source connected to global bitline 135, and a drain connected to global bitline 140. In an alternate example, transistor device 150 may be a PFET, transistor device 155 may be an NFET, and transistor device 160 may be an PFET.

Figure 2:
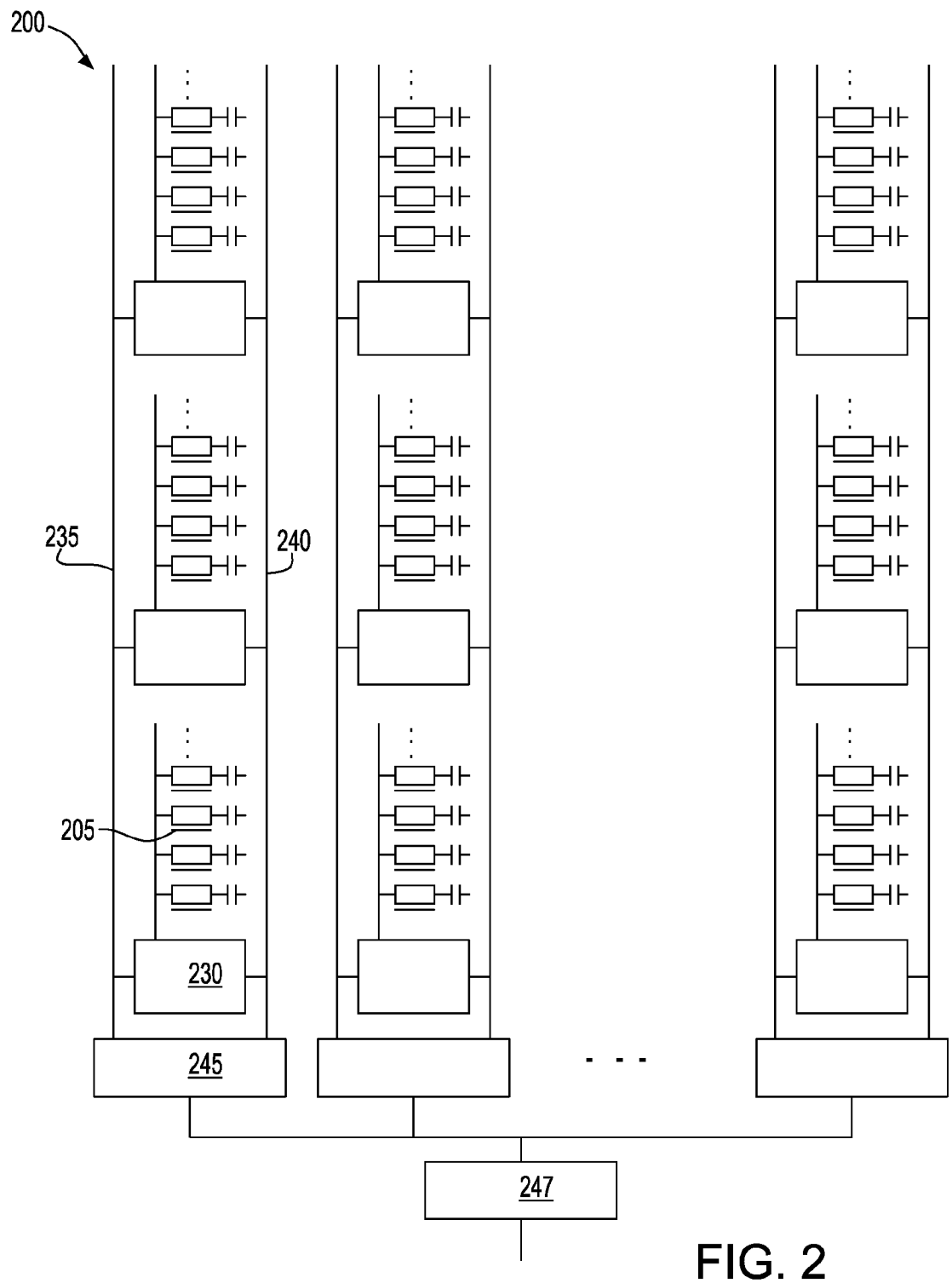
FIG. 2 shows one embodiment of a memory cell array.

FIG. 2 illustrates one example of a memory cell array 200 having a plurality of memory cells 205 in communication with a local sense amplifier 230. A plurality of memory cell 205/local sense amplifier 230 combinations are connected to a read bitline 235 and a write bitline 240. Read bitline 235 and write bitline 240 are connected to a secondary sense amplifier 245. A plurality of secondary sense amplifiers (e.g., secondary sense amplifier 245), each having a plurality of local sense amplifier/memory cell combinations, may be connected to a local buffer 247. Any number of secondary sense amplifiers may be connected to a local buffer depending on the memory application, as will be recognized by those skilled in the art. In one example, eight secondary sense amplifiers are connected to local buffer 247. Any number of local buffers (e.g., local buffer 247) may be connected together in a memory macro (e.g, a DRAM macro) depending on the memory application, as will be recognized by those skilled in the art. In one example, eight local buffers may be connected together in a memory macro.

Figure 3:
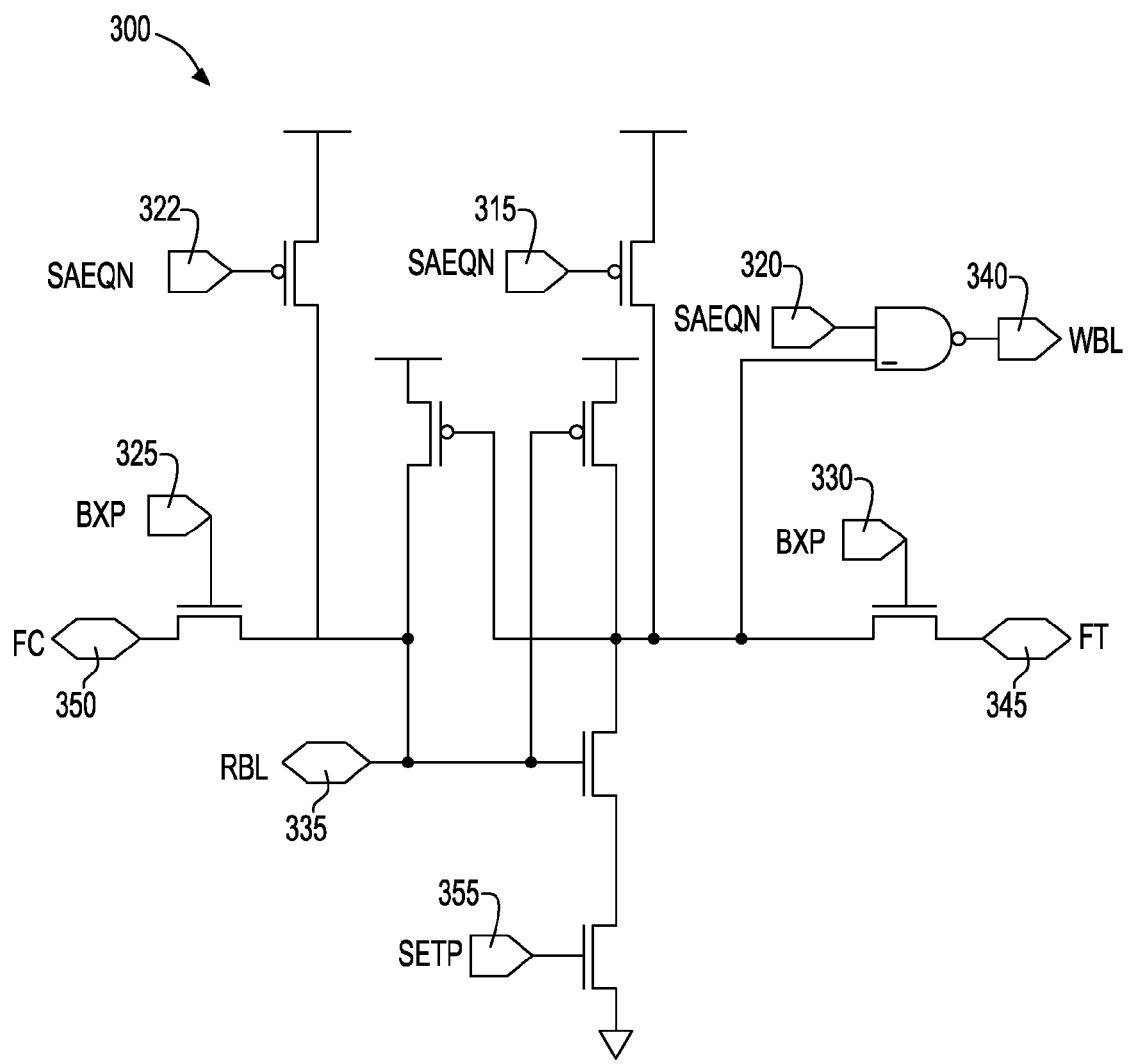
FIG. 3 shows one embodiment of a secondary sense amplifier.

FIG. 3 illustrates one example of a secondary sense amplifier 300 for connection to one or more sets of global bitlines (e.g., global bitlines 135, 140). Those skilled in the art will recognize alternate circuit configurations for a secondary sense amplifier that may be utilized with one or more local sense amplifiers (e.g., local sense amplifier 130) according to the present disclosure. Secondary sense amplifier 300 includes a connection 340 to a write global bitline, such as global bitline 140 (WBL), and a connection 335 to a read global bitline, such as global bitline 135 (RBL). Secondary sense amplifier 300 also includes a connection 315, a connection 320, a connection 322, each to a sense amp equalize (SAEQN); a connection 325 and a connection 330, each to a bit switch (BXP); and a connection 355 to a shared timer (SETP). Secondary sense amplifier 300 further includes a connection 350 to a compliment data line (FC) and a connection 345 to a true data line (FT).

Figure 4:
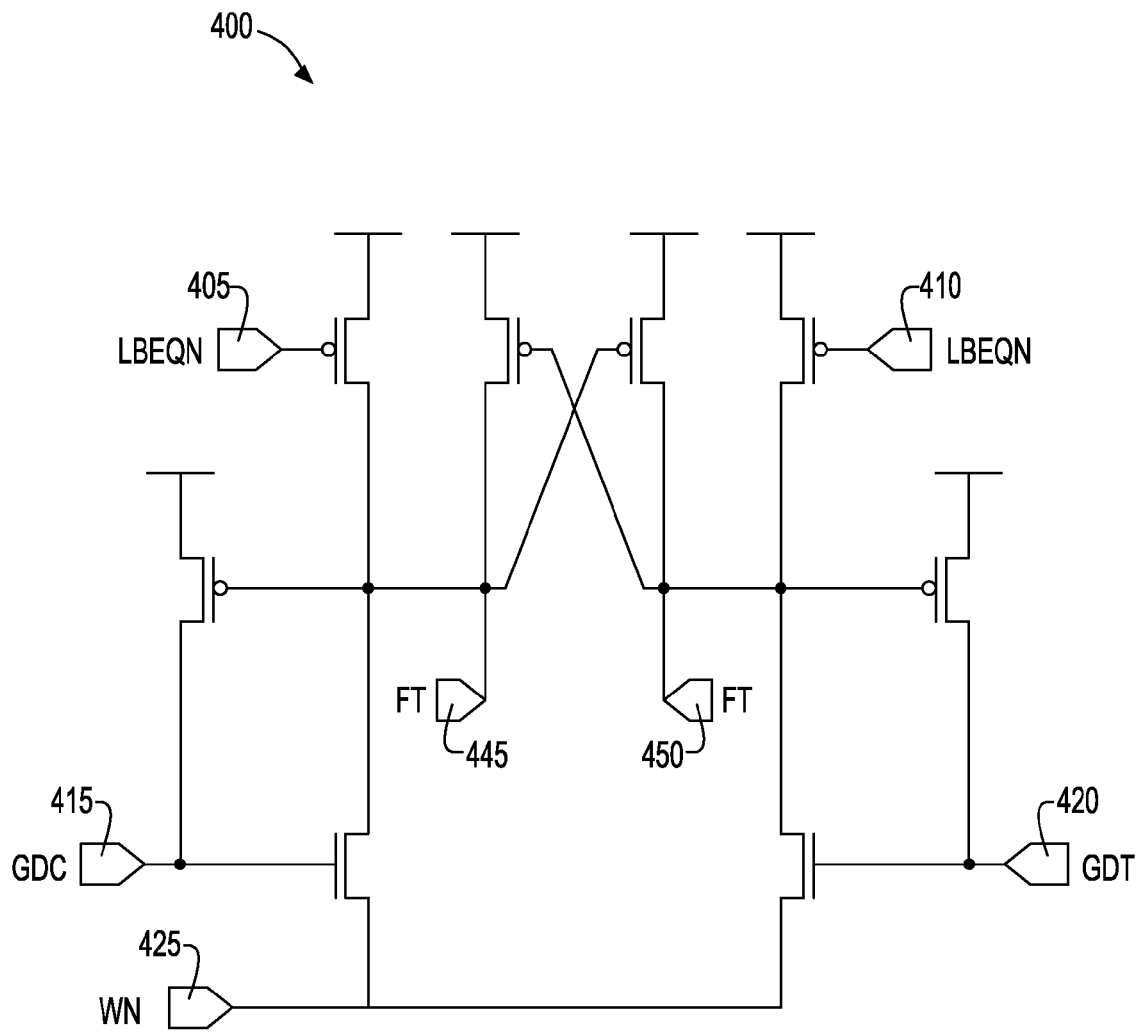
FIG. 4 shows one embodiment of a local buffer.

FIG. 4 illustrates one example of a local buffer 400 for connection to one or more secondary sense amplifiers (e.g., sense amplifier 300). Those skilled in the art will recognize alternate circuit configurations for a local buffer that may be utilized with one or more secondary sense amplifiers according to the present disclosure. Local buffer 400 includes a connection 405 and a connection 410, each to a local buffer equalize (LBEQN). Local buffer 400 also includes a connection 415 to a global compliment data input/output (GDC), a connection 420 to a global true data input/output (GDT), and a connection 425 to a write enable (WN). Local buffer 400 further includes a connection 450 to a compliment data line (FC) and a connection 445 to a true data line (FT). In one example, connection 450 may be in communication with connection 350 of the example secondary sense amplifier of FIG. 3 and connection 445 may be in communication with connection 345 of the example secondary sense amplifier of FIG. 3.

Figure 5:
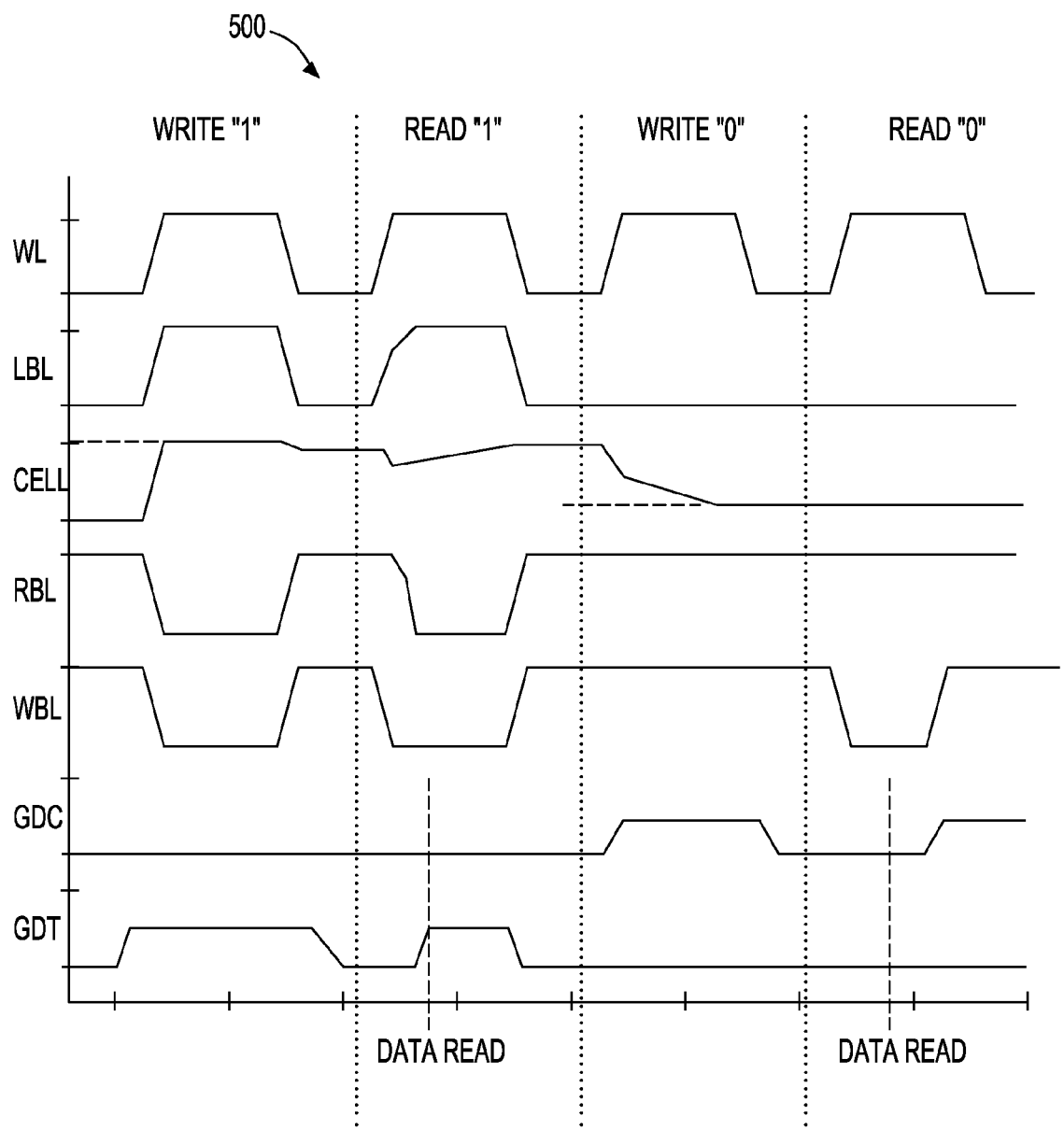
FIG. 5 shows one example of a timing graph illustrating exemplary states of one embodiment of a circuit for accessing a memory cell.

Referring again to FIG. 1, circuit 100 may be utilized to read and/or write a value from and/or to memory cell 105. Operation of exemplary circuit 100 will be described with further reference to timing graph 500 of FIG. 5. Timing graph 500 illustrates one example of the charge over time on wordline 125 (abbreviated on graph 500 as "WL"), local bitline 115 (LBL), node 110 (Cell), global bitline 135 (RBL), global bitline 140 (WBL), global compliment data input/output 415 (GDC), and global true data input/output 420 (GDT) during four example write/read operations indicated as WRITE "1", READ "1", WRITE "0", READ "0".

Circuit 100 may be utilized to write a data value to node 110. In one example a logical value of "1" (e.g., charged high, for example to about 1 volt (V)) may be written to node 110. Timing graph 500 illustrates one example of writing a "1" value to node 110 (WRITE "1"). In this example, an initial state at the beginning of the cycle of wordline 125 for local bitline 115 is logically low, global bitline 135 is logically high, global bitline 140 is logically high, GDC is logically low, and GDT is logically low. The initial state of node 110 may be either that of a logical "1" (logically high), as indicated by the dotted line in timing graph 500, a logical "0" (logically low), as indicated by the solid line in timing graph 500, or somewhere in between. In writing a value of "1," local sense amplifier 130 is enabled to write a value. In one example, global bitlines 135 and 140 are driven low to enable local sense amplifier 130 to write a value of "1". As global bitline 135 decreases in voltage, transistor device 150 becomes logically active, exposing local bitline 115 to power supply 165 (e.g., a 1 V VDD). As global bitline 140 decreases in voltage, transistor device 155 becomes logically inactive, breaking connection of local bitline 115 to ground. Local bitline 115 is driven high. At a predetermined point, wordline 125 is activated (e.g., if transistor device 120 is a PFET, wordline 125 is driven low, if transistor device 120 is an NFET, wordline 125 is driven high) driving node 110 to a high (or logical "1") state. A logical "1" is retained by deactivating wordline 125 such that transistor device 120 breaks the connection between node 110 and local bitline 115. At the end of a cycle, global bitlines 135, 140 are driven high (e.g., by driving SAEQN low). As global bitline 135 increases in voltage, transistor device 150 breaks the connection between power supply 165 and local bitline 115. As global bitline 140 increases in voltage, transistor device 155 connects local bitline 115 to ground. Local bitline 115 is driven low. The logical value "1" is retained in node 110.

In one example of preparing a local sense amplifier (e.g., local sense amplifier 130) to read and/or write where secondary sense amplifier 145 includes circuitry according to FIG. 3, SAEQN 315, 320, 322 goes high, driving WBL 340 low, enabling local sense amplifiers connected to a global bitline in communication with WBL 340 (e.g., global bitline 140) to either read or write.

Referring to FIG. 2, another example of writing a "1" to a memory node will be described where secondary sense amplifier 245 includes circuitry according to FIG. 3 and local buffer 247 includes circuitry according to FIG. 4. Local sense amplifier 230 is enabled to read and/or write by setting SAEQN 315, 320, 322 high, driving WBL 340 low. Substantially at the same time, LBEQN 405/410 goes high and WN 425 goes low enabling local buffer 247 to write data to a single secondary sense amplifier 245, which is uniquely enabled by activation of its BXP 325, 330 signal (e.g., each of secondary sense amplifiers 245 may include a unique BXP signal connection for enabling the specific secondary sense amplifier 245 to be read from or written to via local buffer 247). GDT 420 is remotely (e.g., an input from a processor) driven high forcing FC 450 low. In turn, this causes secondary sense amplifier 245 to drive RBL 335 (and a global bitline, such as global bitline 135, connected thereto) low. This in turn drives a local bitline, such as local bitline 115, high. When a wordline (e.g., wordline 125) corresponding to a memory cell (e.g., memory cell 105) that is connected to the local bitline is activated, the corresponding node (e.g., node 110) is driven high. Deactivating wordline 125 retains the high (logical "1") value at the memory cell node. The system is returned to the precharge state by driving SAEQN 315, 320, 322 and LBEQN 405, 410 low and remotely returning GDT 420 and GDC 415 low.

In another example, a logical "0" may be written to node 110. Timing graph 500 illustrates one example of writing a logical "0" to node 110 (WRITE "0"). an initial state at the beginning of the cycle of wordline 125 for local bitline 115 is logically low, global bitline 135 is logically high, global bitline 140 is logically high, GDC is logically low, and GDT is logically low. The initial state of node 110 may be either that of a logical "1" (logically high), as indicated by the dotted line in timing graph 500, a logical "0" (logically low), as indicated by the solid line in timing graph 500, or somewhere in between. In writing a zero, global bitlines 135, 140 are held high (e.g., at the receipt of data early or on time, such as via GDC being high and GDT being low). With global bitline 135 held high, transistor device 150 remains inactive. With global bitline 140 held high, transistor device 155 remains active. Thus, local bitline 115 is held low. When wordline 125 activates (i.e., opens) transistor device 120, charge sharing between local bitline 115 and node 110 results in node 110 being driven logically low independent of the prior state. Wordline 125 is deactivated and node 110 remains low (logical value "0"). The circuit may be returned to the precharge state.

Referring to FIG. 2, another example of writing a "0" to a memory node will be described where secondary sense amplifier 245 includes circuitry according to FIG. 3 and local buffer 247 includes circuitry according to FIG. 4. LBEQN 405/410 goes high and WN 425 goes low enabling local buffer 247 to write data to a single secondary sense amplifier 245, which is uniquely enabled by activation of its BXP 235, 330 signal. GDC 415 is remotely (e.g., an input from a processor) driven high forcing FT 445 low, forcing FC 450 high causing secondary sense amplifier 245 to drive WBL 340 (and a global bitline, such as global bitline 140, connected thereto) high. This in turn drives a local bitline, such as local bitline 115, low. When a wordline (e.g., wordline 125) corresponding to a memory cell (e.g., memory cell 105) that is connected to the local bitline is activated, the corresponding node (e.g., node 110) is driven low. Deactivating wordline 125 retains the high (logical "0") value at the memory cell node. The system is returned to the precharge state by driving SAEQN 315, 320, 322 and LBEQN 405, 410 low and remotely returning GDT 420 and GDC 415 low.

In yet another example, circuit 100 may be utilized to read a value stored at node 110. Node 110 may include a logical value of "1" (e.g., charged high, for example to about 1 volt (V)). In an example of reading a "1" value, the initial state of local bitline 115 is low, global bitline 135 is high, and global bitline 140 is high. The initial state of node 110 is high. Global bitline 140 is driven low by secondary sense amplifier 145. Low voltage on global bitline 140 deactivates transistor device 155. Wordline 125 activates transistor device 120 causing charge sharing between node 110 and local bitline 115. Rising voltage on local bitline 115 causes transistor device 160 to become logically active. The low voltage on global bitline 140 begins discharge of global bitline 135 across transistor device 160. Secondary sense amplifier 145 reads the low voltage on global bitline 135 as a logical "1" (e.g., as an increasing voltage at GDT). In one example where secondary sense amplifier 145 includes circuitry according to FIG. 3 and a local buffer includes circuitry according to FIG. 4, global bitline RBL 135/335 pulls FC 350, 450 low, causing local buffer 400 to drive GDT 420 high. A high value on GDT 420 may be read as a logical "1". As the voltage on global bitline 135 goes down, transistor device 150 begins to create a connection to power supply 165, which increases the voltage on local bitline 115, further increasing the drive on transistor 160. At a point in the discharge of global bitline 135 while wordline 125 is still activated, local sense amplifier 130 begins to drive local bitline 115 high enough to replenish node 110 to about or above its original value. In one example, the voltage on global bitline 135 decreases, transistor device 150 opens to power supply 165, and local bitline 115 is driven high. As the voltage on local bitline 115 rises, transistor device 160 closes. The high voltage on local bitline 115 also charge shares with node 110 to replenish the logical "1" to node 110. At a predetermined end of read point, wordline 125 is deactivated closing transistor device 120 and locking the value of node 110. Global bitlines 135 and 140 are driven high to return them to initial state. In this example, secondary sense amplifier 145 is configured to read a low voltage on global bitline 135 as a "1." In an alternative embodiment utilizing different field effect transistors, secondary sense amplifier 145 may be configured to read a high voltage on global bitline 135 as a "1."

In still yet another example, node 110 may include a logical "0" (e.g., charged low). In an example of reading a "0" value, the initial state of local bitline 115 is low, global bitline 135 is high, and global bitline 140 is high. The initial state of node 110 is low. Global bitline 140 is driven low by secondary sense amplifier 145. Low voltage on global bitline 140 deactivates transistor device 155. Wordline 125 activates transistor device 120 causing charge sharing between node 110 and local bitline 115. With low voltage on local bitline 115 and low voltage on node 110, no charge is transferred and local bitline 115 remains low, transistor device 160 remains inactive, and the voltage on global bitline 135 remains high, which in turn leaves transistor device 150 inactive. At a predetermined point global bitline 135 is sampled as high (e.g., when SETP 355 of FIG. 3 rises). In one example where secondary sense amplifier 145 includes circuitry according to FIG. 3, SETP 355 rises causing FT 345, 445 to be driven low, which in turn drives GDC 415 high. A high value at GDC 415 may be read as a logical "0." Secondary sense amplifier 145 drives global bitline 140 high to replenish the "0." In one example where secondary sense amplifier 145 includes circuitry according to FIG. 3 and a local buffer includes circuitry according to FIG. 4, SETP 355 rising drives WBL 340 high (which in turn drives the gate of transistor 155 high to replenish the logical "0"). At the end of the cycle, wordline 125 deactivates transistor device 120 locking in a low voltage (i.e., a logical "0") on node 110. Circuit 100 may be returned to the precharge state.

Timing graph 500 illustrates a cycle time of 2 nanoseconds (ns) for wordline 125. In one example, only one memory cell on a local bitline may be read to or written to at a given time. In another example, only one memory cell on each set of global bitlines may be read to or written to at a given time. Those skilled in the art will recognize a variety of ways to control one or more wordlines in a memory device in order to assure proper read/write.

One example of a configuration for local sense amplifier 130 designed to drive global bitline 135 low when reading a "1" is illustrated in FIG. 1. In an alternative example, local sense amplifier 130 may be configured alternatively to drive global bitline 135 high when reading a "0" and secondary sense amplifier 145 configured to read a high voltage on global bitline 135 as a "0".

In one aspect, a circuit for reading from and/or writing to a memory cell according to the present disclosure provides high performance refreshing of a memory cell. In another aspect, a write bitline of a circuit according to the present disclosure provides a shield during read processes. In yet another aspect, a circuit according to the present disclosure provides a low bitline capacitance (e.g., a bitline pitch of 2×). In one example, global charging current is provided via a write bitline and is not shared on a common source line. In such an example, data pattern IR drop is reduced. In still another aspect, a circuit according to the present disclosure may provide word shift redundancy due to a lack of row decode for a common source line. In a further aspect, an example circuit of the present disclosure having a three transistor local sense amplifier provides a smaller circuit footprint than conventional cross-coupling sense amplifiers and four transistor sense amplifiers.

Figure 6:
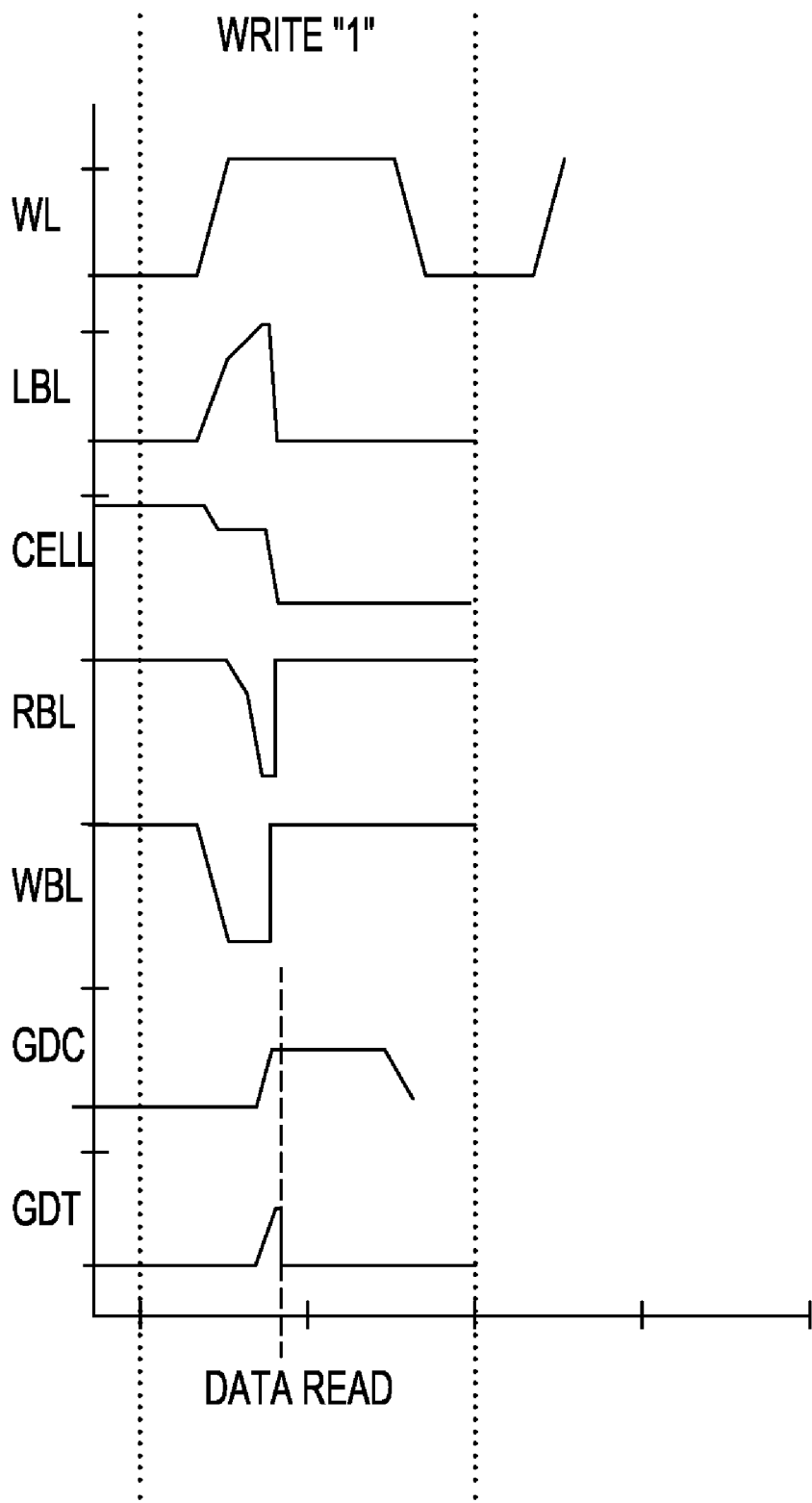
FIG. 6 shows another example of a timing graph illustrating exemplary states of one embodiment of a circuit for accessing a memory cell.

In still a further example, a circuit of the present disclosure may support a masked early write to a memory node. In such an example, data can be written early to a subset of cells on a wordline without impact to refreshing cells on same wordline. FIG. 6 illustrates a timing graph for one example of a write procedure of a logical "0" where the data arrives late in the cycle. The initial state of local bitline 115 is low, global bitline 135 is high, and global bitline 140 is high. The initial state of node 110 is high. To start the read cycle, global bitline 140 is driven low. Low voltage on global bitline 140 deactivates transistor device 155. Wordline 125 activates transistor device 120 causing charge sharing between node 110 and local bitline 115. Rising voltage on local bitline 115 causes transistor device 160 to become logically active. The lower voltage on global bitline 140 begins discharge of global bitline 135 across transistor device 160. In one example, the decreasing voltage on global bitline 135 is indicated as an increasing voltage on a GDT. However, when the logical "0" data arrives late (e.g., increasing voltage on a GDC and decrease in voltage on GDT), global bitline 140 and global bitline 135 are driven high. Thus, transistor device 150 is deactivated, transistor device 155 is opened, and local bitline 115 is driven low. In one example, the data may arrive prior to the cycle for reading the contents of node 110. In another example, the data may arrive late and drive local bitline 115 low prior to wordline 125 deactivating. In such an example, a charge sharing between local bitline 115 and node 110 drives node 110 low to a logical value "0." Wordline 125 deactivates and locks in the logical value "0."

Figure 7:
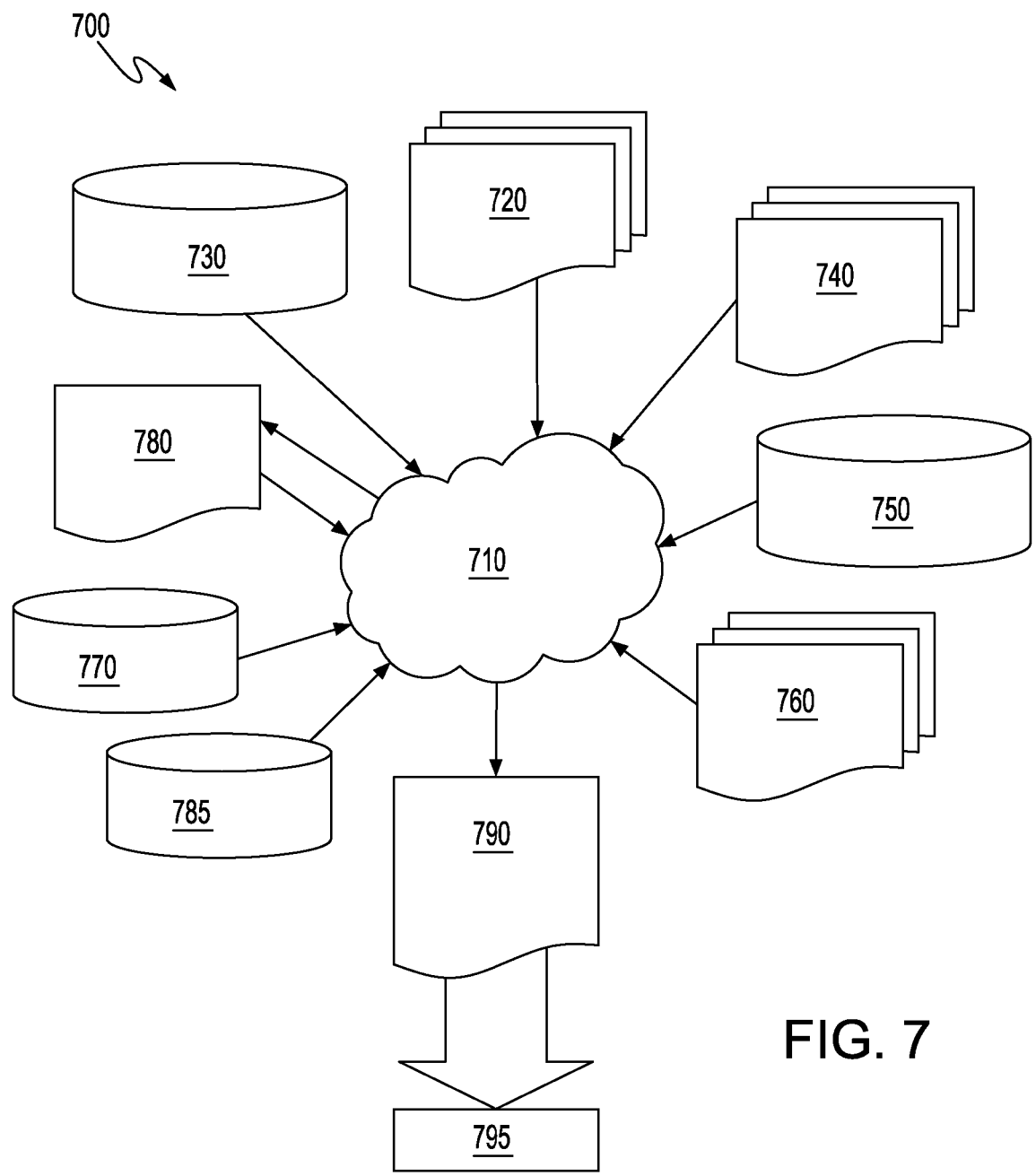
FIG. 7 shows a flow diagram of a design process used in semiconductor design, manufacturing and/or test.

FIG. 7 shows a block diagram of an example design flow 700. Design flow 700 may vary depending on the type of IC being designed. For example, a design flow 700 for building an application specific IC (ASIC) may differ from a design flow 700 for designing a standard component. Design structure 720 is preferably an input to a design process 710 and may come from an IP provider, a core developer, or other design company or may be generated by the operator of the design flow, or from other sources. Design structure 720 comprises circuit 100 in the form of schematics or HDL, a hardware-description language (e.g., Verilog, VHDL, C, etc.) Design structure 720 may be contained on one or more machine readable medium. For example, design structure 720 may be a text file or a graphical representation of circuit 100. Design process 710 preferably synthesizes (or translates) circuit 100 into a netlist 780, where netlist 780 is, for example, a list of wires, transistors, logic gates, control circuits, I/O, models, etc. that describes the connections to other elements and circuits in an integrated circuit design and recorded on at least one of machine readable medium. This may be an iterative process in which netlist 780 is resynthesized one or more times depending on design specifications and parameters for the circuit.

Design process 710 may include using a variety of inputs; for example, inputs from library elements 730 which may house a set of commonly used elements, circuits, and devices, including models, layouts, and symbolic representations, for a given manufacturing technology (e.g., different technology nodes, 32 nm, 45 nm, 90 nm, etc.), design specifications 740, characterization data 750, verification data 760, design rules 770, and test data files 785 (which may include test patterns and other testing information). Design process 710 may further include, for example, standard circuit design processes such as timing analysis, verification, design rule checking, place and route operations, etc. One of ordinary skill in the art of integrated circuit design can appreciate the extent of possible electronic design automation tools and applications used in design process 710 without deviating from the scope and spirit of the invention. The design structure of the invention is not limited to any specific design flow.

Ultimately, design process 710 preferably translates circuit 100, along with the rest of the integrated circuit design (if applicable), into a final design structure 790 (e.g., information stored in GDS storage medium). Final design structure 790 may comprise information such as, for example, test data files, design content files, manufacturing data, layout parameters, wires, levels of metal, vias, shapes, test data, data for routing through the manufacturing line, and any other data required by a semiconductor manufacturer to produce circuit 100. Final design structure 790 may then proceed to a stage 795 where, for example, final design structure 790: proceeds to tape-out, is released to manufacturing, is sent to another design house or is sent back to the customer.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A design structure embodied in a machine readable medium used in a design process, the design structure comprising:
  a circuit for accessing a memory cell, the circuit comprising:
  a local bitline;
  a local sense amplifier having a plurality of transistors, said local bitline connecting the memory cell to said sense amplifier;
  a first global bitline connected to a first one of said plurality of transistors;
  a second global bitline connected to a second one of said plurality of transistors; and a secondary sense amplifier connected to said first and second global bitlines;
  wherein said local sense amplifier includes:
    a first transistor having a gate connected to said local bitline, a source connected to said first global bitline, and a drain connected to said second global bitline;
    a second transistor having a gate connected to said first global bitline, and a drain connected to said local bitline, and a source connected to first power supply;
    a third transistor having a gate connected to said second global bit line, a source connected to a second power supply, a drain connected to said local bitline.

2. The design structure of claim 1, wherein the design structure comprises a netlist, which describes the circuit.

3. The design structure of claim 1, wherein the design structure includes at least one item selected from the group consisting of test data files, characterization data, verification data, and design specifications.

4. A design structure embodied in a machine readable medium used in a design process, the design structure comprising:
  a circuit for accessing a memory cell, the circuit comprising:
  a local bitline;
  a first global bitline;
  a second global bitline; and
  a local sense amplifier having:
    a first transistor having a gate connected to said local bitline, a source connected to said first global bitline, and a drain connected to said second global bitline;
    a second transistor having a gate connected to said first global bitline, a drain connected to said local bitline, and a source connected to a first power supply; and
    a third transistor having a gate connected to said second global bitline, a source connected to a second power supply, and a drain connected to said local bitline,
  wherein said local bitline connects the memory cell to said sense amplifier.

5. The design structure of claim 4, wherein the design structure comprises a netlist, which describes the circuit.

6. The design structure of claim 4, wherein the design structure includes at least one item selected from the group consisting of test data files, characterization data, verification data, and design specifications.

* * * * *